US008963659B1

(12) United States Patent
Goldsmith et al.

(10) Patent No.: US 8,963,659 B1
(45) Date of Patent: Feb. 24, 2015

(54) ELECTROSTATIC MEMS DEVICES WITH HIGH RELIABILITY

(76) Inventors: Charles L. Goldsmith, Plano, TX (US); Orlando H. Auciello, Bolingbrook, IL (US); Anirudha V. Sumant, Plainfield, IL (US); Derrick C. Mancini, Argonne, IL (US); Chris Gudeman, Lompoc, CA (US); Suresh Sampath, Santa Barbara, CA (US); John A. Carlilse, Romeoville, IL (US); Robert W. Carpick, Philadelphia, PA (US); James Hwang, Bethlehem, PA (US)

( * ) Notice: Subject to any disclaimer, the term of this patent is extended or adjusted under 35 U.S.C. 154(b) by 250 days.

(21) Appl. No.: 13/114,945

(22) Filed: May 24, 2011

Related U.S. Application Data

(63) Continuation of application No. 13/081,683, filed on Apr. 7, 2011, now Pat. No. 8,525,185.

(60) Provisional application No. 61/321,563, filed on Apr. 7, 2010, provisional application No. 61/347,743, filed on May 24, 2010.

(51) Int. Cl.
*H01H 51/22* (2006.01)

(52) U.S. Cl.
USPC ............................................. 335/78; 200/181

(58) Field of Classification Search
USPC ............................................. 335/78; 200/181
See application file for complete search history.

(56) References Cited

U.S. PATENT DOCUMENTS

| | | |
|---|---|---|
| 5,526,172 A | 6/1996 | Kanack |
| 5,619,061 A | 4/1997 | Goldsmith et al. |
| 6,391,675 B1 | 5/2002 | Ehmke et al. |
| 6,422,077 B1 * | 7/2002 | Krauss et al. .............. 73/514.25 |
| 6,608,268 B1 | 8/2003 | Goldsmith |
| 6,700,172 B2 | 3/2004 | Ehmke et al. |
| 6,777,765 B2 * | 8/2004 | Chen et al. ..................... 257/415 |
| 6,811,612 B2 * | 11/2004 | Gruen et al. ..................... 117/94 |
| 2012/0193684 A1 * | 8/2012 | Sumant et al. ................ 257/254 |
| 2012/0193685 A1 * | 8/2012 | Goldsmith et al. ........... 257/254 |

OTHER PUBLICATIONS

Goldsmith et al., "Micromechanical Membrane Switches for Microwave Applications," IEEE Microwave Theory Tech. Symp. Dig., pp. 91-94, May 1995.
Goldsmith et al., "Characteristics of Micromachined Switches at Microwave Frequencies," IEEE Microwave Theory Tech. Symp. Dig., pp. 1141-1144, Jun. 1996.
Goldsmith et al., "Performance of Low-Loss RF MEMS Capacitive Switches," IEEE Microwave and Guided Wave Lett, vol. 8, No. 8, pp. 269-271, Aug. 1998.
Yuan et al., "Temperature Acceleration of Dielectric Charging of RF MEMS Capacitive Switches," 2006; IEEE International Microwave Symposium, paper TU1B-5, Jun. 2006.
Yuan et al., "Acceleration of Dielectric Charging in RF MEMS Capacitive Switches," IEEE Trans Dev and Mat Reliability, vol. 6, No. 4, pp. 556-563, Dec. 2006.

* cited by examiner

*Primary Examiner* — Bernard Rojas
(74) *Attorney, Agent, or Firm* — CARR Law Firm PLLC

(57) ABSTRACT

The present invention provides for an electrostatic microelectromechanical (MEMS) device comprising a dielectric layer separating a first conductor and a second conductor. The first conductor is moveable towards the second conductor, when a voltage is applied to the MEMS device. The dielectric layer recovers from dielectric charging failure almost immediately upon removal of the voltage from the MEMS device.

14 Claims, 7 Drawing Sheets

ELECTROSTATIC MEMS DEVICES WITH HIGH RELIABILITY

CROSS-REFERENCE TO RELATED APPLICATIONS

This application relates to, and claims the benefit of the filing date of, U.S. provisional patent application Ser. No. 61/347,743 entitled ELECTROSTATIC MEMS DEVICES WITH HIGH RELIABILITY, filed May 24, 2010, the entire contents of which are incorporated herein by reference for all purposes; and is a continuation of co-pending U.S. patent application Ser. No. 13/081,683 entitled RF-MEMS CAPACITIVE SWITCHES WITH HIGH RELIABILITY, filed Apr. 7, 2011, which relates to, and claims the benefit of the filing date of, U.S. provisional patent application Ser. No. 61/321,563 entitled RF MEMS CAPACITIVE SWITCHES WITH HIGH RELIABILITY, filed Apr. 7, 2010.

STATEMENT REGARDING FEDERALLY SPONSORED RESEARCH OR DEVELOPMENT

The United States Government has rights in this invention pursuant to Contract No. DE-FG02-02ER46016 between the U.S. Department of Energy (DOE) and UChicago Argonne, LLC representing Argonne National Laboratory and pursuant to Contract No. MIPR06-W238 between the Defense Advanced Research Projects Agency (DARPA) and UChicago Argonne, LLC representing Argonne National Laboratory.

BACKGROUND OF THE INVENTION

This invention relates generally to electrostatically operated microelectromechanical systems (MEMS) devices and, more particularly, to radio frequency (RF) capacitive MEMS switches, and other devices utilizing dielectric materials.

RF MEMS capacitive switches have many useful applications for military and commercial RF and microwave applications. An RF MEMS capacitive switch comprises a movable metal membrane (upper electrode) suspended above a lower electrode and interposing dielectric layer. An air gap of several microns typically separates the upper membrane from the dielectric layer. The lower electrode comprises a RF signal path, while the upper electrode (whether separate or being the membrane) comprises a RF and DC ground. In the switch "off state", the air gap between the membrane and lower electrode is sufficient that the upper membrane has an insignificant parasitic capacitance relative to the operating frequency of the switch. When a voltage is applied across the upper and lower electrodes, the electrostatic force pulls the membrane down into contact with the dielectric layer ("on state"). Without a significant air gap, the upper metal membrane, insulator layer, and lower metal electrode form an MIM (metal-insulator-metal) capacitor. This capacitor is designed to achieve sufficient capacitive conductance such that it can capacitively couple, or even short, the RF signal path of the lower electrode to the grounded upper metal membrane. When the applied voltage is released, the restoring force of the membrane metal spring is sufficient to return the membrane to its "off state." This assumes no secondary effects impede that action, such as charging of the dielectric layer and/or the force of adhesion between the membrane and the dielectric layer.

Electronic switching devices such as RF-microelectromechanical (RF MEMS) switches provide many potential benefits over conventional semiconductor-based switches for controlling and routing microwave and millimeter-wave signals. RF MEMS switches possess very low insertion loss, miniscule power consumption, and ultrahigh linearity. These characteristics make RF MEMS switches ideal candidates for incorporation into passive circuits, such as phase shifters or tunable filters, for implementation in communications and radar systems at RF, microwave, and millimeter-wave frequencies (10 MHz-100 GHz and up).

The insertion into military and/or commercial high frequency systems has been limited by a lack of reliability. In a well-engineered RF MEMS switch, dielectric charging is the main limitation to lifetime, as opposed to mechanical effects. When the switch actuates, a relatively high voltage (30-50 volts) is applied across the relatively thin switch insulator. The resulting electric field induces charge tunneling into the insulator, where they are trapped. As these charges build up, they shift the pull-in and release voltages of the switch. If enough charges become trapped, the operating voltages will shift sufficiently such that the switch will either remain stuck down, or not actuate when desired. In either case, the switch fails to operate properly.

The primary failure mode of conventional prior art RF MEMS capacitive switches is accumulation of charges within the insulator layer made of silicon oxide or silicon nitride materials of the switch, in which charges tunnel into and become trapped within the dielectric. The conventional prior art RF MEMS capacitive switch only recovers from this failure after a sufficiently long period of time (hours to days) during which the trapped charges can diffuse or migrate back to the metal electrodes.

It is, therefore, desirable to provide an improved reliable RF MEMS capacitive switch, or any electrostatically operated MEMS device involving dielectric layers, which overcomes most, if not all of the disadvantages described above.

SUMMARY OF THE INVENTION

The present invention provides for an electrostatic microelectromechanical (MEMS) device comprising a dielectric layer separating a first conductor and a second conductor. The first conductor is moveable towards the second conductor, when a voltage is applied to the MEMS device. The dielectric layer recovers from dielectric charging failure almost immediately upon removal of the voltage from the MEMS device.

BRIEF DESCRIPTION OF THE DRAWINGS

For a more complete understanding of the present invention and the advantages thereof, reference is now made to the following Detailed Description taken in conjunction with the accompanying drawings, in which:

FIG. 5 is a diagram and chart showing a switch life-time of a RF MEMS capacitive switch with;

DETAILED DESCRIPTION OF THE INVENTION

The following is a detailed description and explanation of the preferred embodiments of the invention and best modes for practicing the invention.

I. RF MEMS Switch Structure

Figure 1:
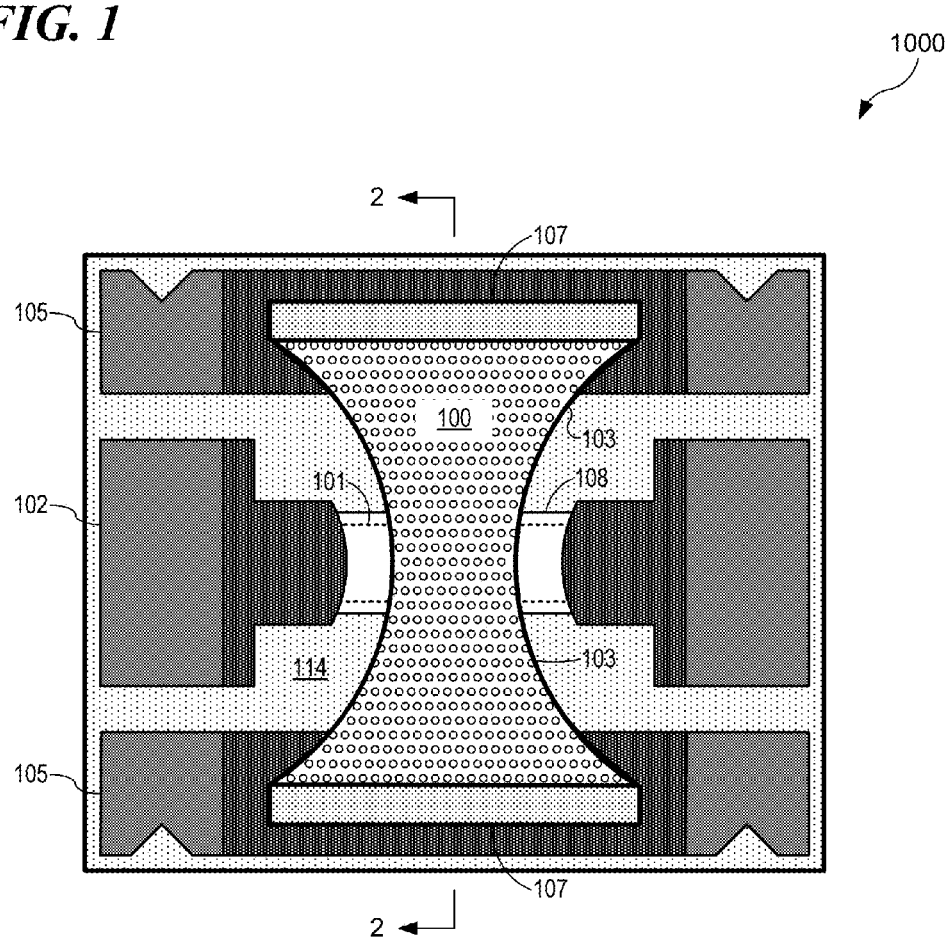
FIG. 1 is an optical microscopy picture of a top plan view of a RF MEMS capacitive switch the first embodiment.
Figure 2A:
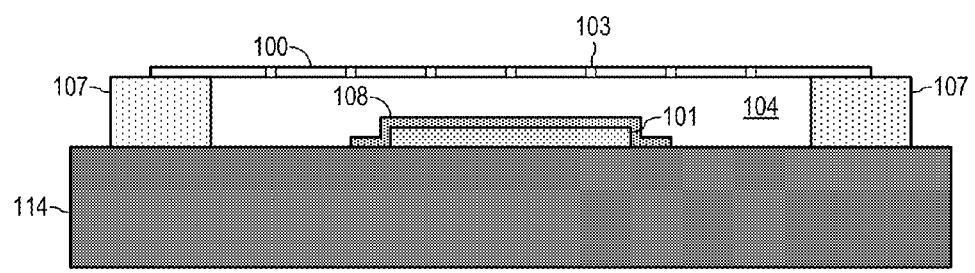
FIG. 2A is a cross-sectional schematic view of a RF MEMS capacitive switch in and an "on" state, and 2B is a cross-section schematic view of a RF MEMS capacitive switch in an "off" state.
Figure 2B:
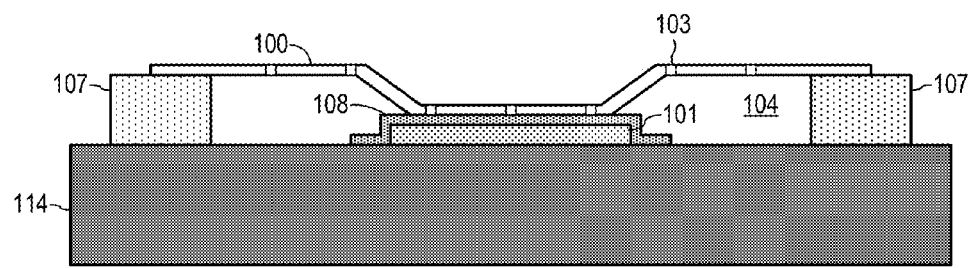

Referring to the FIGS. 1 and 2A and 2B, one embodiment of a MEMS device may comprise a RF MEMS capacitive switch 1000. The RF MEMS switch 1000 may comprise a first conductor, such as moveable membrane 100 suspended over a second conductor, such as bottom electrode 101. The bottom electrode 101 may provide an RF signal path 102. A dielectric layer 108 may be interposed between to separate the moveable membrane 100 from the bottom electrode 101. In some embodiments, the dielectric layer 108 may extend on top of the bottom electrode 101.

The moveable membrane 100 may function as a top electrode carrying an electric charge. The suspended moveable membrane 100 may span two coplanar ground lines 105. The moveable membrane 100 may be actuated electrostatically from an "off" position in an "off-state" (as shown in FIG. 2A), where no voltage is applied to the moveable membrane 100 to an "on" position in an "on-state" (as shown in FIG. 2B), where voltage is applied. Application of voltage between the top electrode of the moveable membrane 100 and the bottom electrode 101 may create an electrostatic force to draw at least a portion of the moveable membrane 100 towards the bottom electrode 101 to the on position shown in FIG. 2B.

An RF MEMS switch may comprise a operating timeline, which is composed of a series of operating cycles. Each operating cycle may comprise application of a first voltage to the RF MEMS switch followed by removal of the first voltage, and ending when a second voltage is applied to begin the next cycle. The time between application of the first voltage to cessation or removal of the first voltage is the "operating on time," where the moveable membrane 100 is in the on-position. The time from removal of the first voltage to application of a second voltage is the "operating off time," where the moveable membrane 101 is in the off-position. In some embodiments, the operating off time may be relatively short, for example, about 50 microseconds ($\mu$S)

The dielectric layer 108 may provide a dielectric insulating layer on the bottom electrode 101. The dielectric layer 108 may block a DC control signal from shorting out during switch activation, yet may allow RF signals to capacitively couple from the moveable membrane (top electrode) to the lower electrode.

In some embodiments, the dielectric layer 108 may comprise relatively fast discharge properties, which may allow the switch to be held down, in an "on" position for instance, for relatively longer periods of time compared to conventional MEMS switches, with only relatively short time intervals, or switch off time, required to allow the switch 1000 to recover from charging and start anew. The fast discharge properties of the dielectric layer 108 may provide for relatively short discharge time constants on the order of 50 to 1000 microseconds, allowing the RF MEMS switch 1000 to recover almost immediately.

In some embodiments, the RF MEMS switch 1000 may fail and recover every operating cycle, allowing for near continuous operation of the RF MEMS switch 1000. This characteristic of the dielectric layer 108 may allow the operating off time to be as short as about 50 microseconds.

The moveable membrane 100 may be resilient, bendable, or flexible, and may move in response to a force (mechanical, electrostatic, or other), but return to its unactuated shape after the force (mechanical, electrostatic, or other) is removed. The moveable membrane 100 may be supported by posts 107 on a first end and a second end of the moveable membrane 100, each post 107 connected to the ground line 105.

The moveable membrane 100 (top electrode) may comprise an array of holes 103 patterned throughout the moveable membrane 100. Each hole 103 may extend through the moveable membrane 100 from a top side through to a bottom side. The holes 103 are given a size and shape to enable etching of a sacrificial layer underneath the moveable membrane 101. Such etching may occur during switch fabrication.

The moveable membrane 100 (top electrode) may be made of a conductor, such as the metal molybdenum (Mo), which may provide a combination of relatively high conductivity, mechanical robustness, and controlled stress. It will be understood by persons of ordinary skill in the art that other conductors can be used as well, such as Tungsten (W), Aluminum (Al), Titanium (Ti), and other suitable materials known in the art.

The moveable membrane 100 may be 0.1 to 10 micrometers ($\mu$m) or "microns" thick and may be spaced from the bottom electrode 101 by an air gap 104 of about 1 microns to about 10 microns resulting in a substantially insignificant capacitance relative to an operating frequency of the switch 1000. In use, the moveable membrane 100 may be actuated to contact the dielectric layer 108 ("on-state") when a voltage of about 20 volts to about 50 volts is applied across the top electrode 100 and bottom electrode 101. Desirably, the moveable membrane 100 may be integrated with the dielectric layer 108 and the bottom electrode 101 to form a metal-insulator-metal (MIM) capacitor in the "on state" shown in FIG. 2B.

In the illustrative embodiment of FIGS. 1, 2A, and 2B, the bottom electrode 101 may comprise tungsten (W) so as to accommodate higher temperature dielectric deposition. However, other metals, with much higher conductivity than W, could be used if appropriate materials integration are implemented. The use of electrode layers with high electrical conductivity may be required for optimized devices for very high frequency operation.

In some embodiments, the bottom electrode 101 may comprise a stack composed of chrome/tungsten/chrome, instead of the standard chrome/gold/chrome. This electrode stack is designed to withstand higher deposition temperatures without significant metal migration or diffusion. To compensate for the fact that tungsten has a resistivity more than double that of gold, the tungsten film thickness may be doubled to be approximately 0.5 micrometers thick. This helps maintain the switch insertion loss at a low level.

The bottom electrode 101 may be mounted on a substrate 114, such as a glass, quartz, alumina, sapphire, or any other low-loss RF substrate. Substrate material may be chosen to accommodate the higher deposition temperature of diamond (>400 degrees Celsius (C)) relative to material, like silicon dioxide used in conventional switches. Quartz and sapphire may be used in place of borosilicate glass (Pyrex® manufactured by Corning Incorporated, Lowell, Mass.) to permit higher process temperatures. Sapphire substrates may enable the MEMS switch process to be compatible with silicon electronics for CMOS-MEMS co-integration.

The substrate 114 serves as a support for the whole RF MEMS switch structure, including support for the posts 107 supporting the moveable membrane 100. The RF MEMS capacitive switch with the "fast discharge dielectric layer" of ultrananocrystalline diamond (UNCD) may provide a reliable long-life switch with ≥100 billion operation cycles.

The dielectric layer 108 having fast discharge properties may comprise a discharge and recovery time from dielectric charging failure that is almost immediate. In some embodiments, the discharge and recovery time comprises about 50 microseconds out of 100 seconds of applied field, which may be substantially less than the switching time. In some embodiments, the dielectric layer 108 may comprise ultrananocrystalline diamond (UNCD), which exhibits a charging and discharging time constants of about 100 microseconds.

Use of UNCD provides reliable, long life operation of the switch by eliminating the problem of dielectric charging found in conventional RF MEMS capacitive switches, which is the accumulation of charge within the dielectric layer. The UNCD dielectric material of the RF MEMS capacitive switch 1000 has charge and discharge time constants that are on the order of tens to hundreds of microseconds instead of tens to hundreds of seconds for conventional RF MEMS capacitive switches with an insulating layer of silicon dioxide or silicon nitride, for example.

In its operation cycle, the switch 1000, having a voltage applied to begin a operating on time, may reach dielectric charging failure almost immediately, within fifty (50) to one thousand (1000) microseconds. Following the removal of the voltage, the switch 1000 may discharge and recover almost immediately, within fifty (50) to one thousand (1000) microseconds to comprise an operation off time, as a recovery time for the dielectric. The time required for recovery is, in part, dependent on the quick-discharge dielectric properties, the applied electric field, and the switch on-time. Such quick discharge properties of the dielectric layer 108 may allow for near continuous operation of the switch 1000 in the "on" state, with only brief periods, as short as 50 microseconds in some embodiments, in the "off" state to allow for dielectric recovery. Quick discharge dielectrics have unique charging properties with a very fast time constant which allow longer lifetimes than possible with traditional dielectrics.

UNCD thin films may be incorporated into MEMS switch 1000 as at least a portion of the dielectric layer 108 by depositing the material using microwave plasma chemical vapor deposition (MPCVD) or hot filament chemical vapor deposition (HFCVD) techniques. In both cases, UNCD films can be deposited at moderate substrate temperatures of 500-680° C. The MPCVD grown films were produced in a 915 MHz MPCVD system (DiamoTek 1800 series 915 MHz, 10 KW MPCVD system from Lambda Technologies, Inc.). A process may be used involving seeding pretreatment followed by UNCD deposition using Ar/CH4/H2 gas chemistry to achieve diamond films with specific dielectric properties. Such processes are described in U.S. Pat. Nos. 7,556,982 and 7,128,889, which are hereby incorporated by reference. The UNCD nucleation and growth process resulted in a unique film microstructure consisting of equiaxed 3-5 nm grains and about 0.4 nm wide grain boundaries.

Characterization of the UNCD film using Raman spectroscopy and near edge x-ray absorption fine structure spectroscopy (NEXAFS) revealed that the UNCD film is high quality with very high percentage (98%) of sp3 bonded carbon. The UNCD synthesis parameters were optimized to achieve films on quartz substrates with excellent thickness uniformity (variation in thickness of ±5% from center to edge across 150 mm diameter substrates).

The RF MEMS capacitive switch 1000 described here recovers quickly enough for the switch to be available for operation after only a short (microseconds) interruption, a rapid recovery before normal operation resumes. Advantageously, UNCD has low stiction properties, due to the hydrophobic nature of its surface, thus reducing problems related to tribiological interaction between the metal membrane and the dielectric layer. Further, UNDC is chemically inert allowing for processing of films without unwanted etching away.

The RF MEMS capacitive switch 1000 may be fabricated by known methods, such as micromaching and chemical vapor deposition, except that the UNCD dielectric layer 108 may additionally deposited according to the techniques described above.

It will be understood by persons of ordinary skill that the dielectric layer 108 that is interposed between the moveable membrane 100 and the bottom electrode may be deposited onto a bottom surface of the moveable membrane 100 for movement of the dielectric layer 108 with the moveable membrane 100 toward the bottom electrode 101.

II. DC and RF Switch Characteristics

Figure 6:
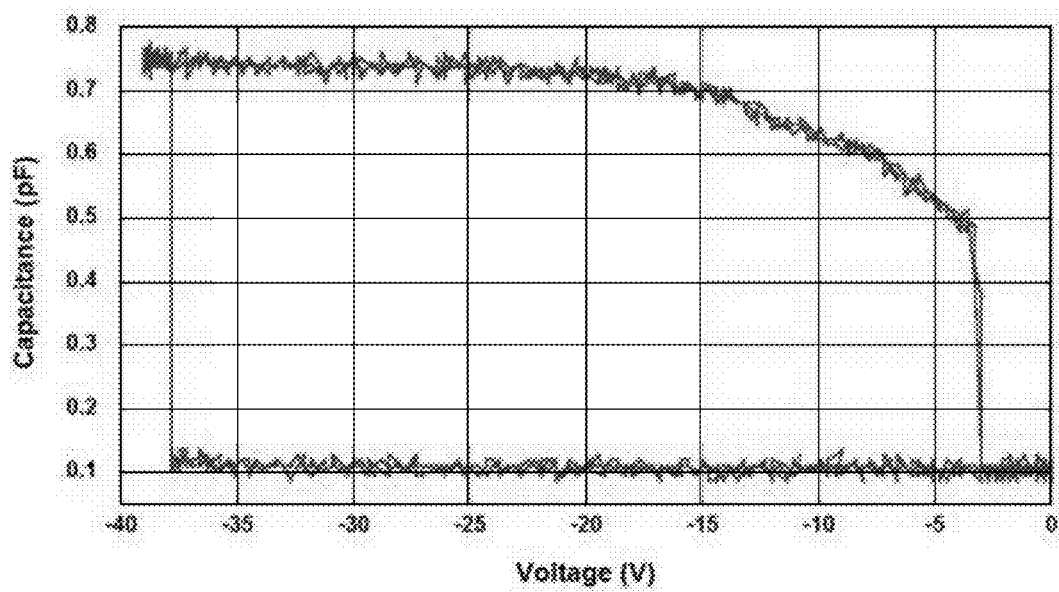
FIG. 6 is a chart showing a C-V curve for a RF MEMS capacitive switch, with an ultrananocrystalline diamond (UNCD) dielectric layer, and with a pull-in actuation voltage $V_p$ of about 38 volts.

Characterization of the electromechanical RF MEMS switch properties typically includes measuring its dynamic operating curve. These properties of the RF MEMS switch 1000 were measured by sweeping bias voltage and measuring the capacitance of the device (C-V curves). A typical characteristic curve is shown in FIG. 6. These switches exhibit actuation voltages in the range of 30-45 volts with an on-capacitance ranging from 650 fF to 800 fF. The on-capacitance is primarily determined by the surface roughness of the lower electrode and the cleanliness of the sacrificial release process. The measured switch off-capacitance ranged from 90 fF to 105 ff, which includes 52 fF of transmission line capacitance. This means that the MEMS plate and fringing capacitance is approximately 38 fF-53 fF.

The DC I-V characteristics of the switch were also measured as part of this characterization. When actuated, 5-25 nA of leakage current flowed through the switch, depending heavily on the operating voltage. To date, there has not been any perceived correlation between UNCD leakage current and the charging properties of these switches.

The RF performance of the RF MEMS switch with the UNCD dielectric layer is typical of most MEMS capacitive switches. When the shunt switch is in the off-state, the insertion loss is very low, on the order of 0.25 dB at 20 GHz. This is slightly higher than the usual insertion loss of 0.15 dB, and is attributed to the less conductive metal used for the lower electrode. When the switch is actuated, isolation is set by the on-capacitance of the device. With 700 fF of on-capacitance, the isolation at 20 GHz is very close to the theoretical value associated with a shunt 700 fF capacitor (7.7 dB). This switch operates more like a switched capacitor (45 fF-725 fF) than a high isolation switch at frequencies below 20 GHz.

Figure 4:
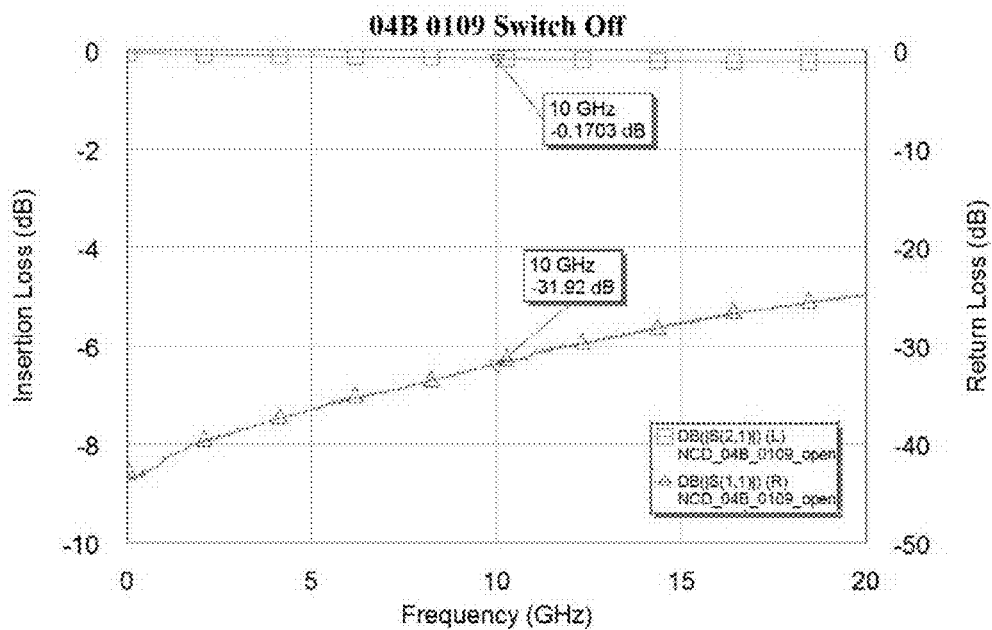
FIG. 4 is a diagram and chart showing the open state insertion loss measurements of a RF-MEMS capacitive switch.

FIG. 4 shows diagrams and chart for insertion and return losses up to 25 GHz for the open-state (off-state) of the RF-MEMS capacitive switch with the UNCD dielectric layer.

The performance at 10 GHz shows an insertion loss of 0.17 dB. This is extracted from S-pars with: $C_{off}$ at 16 ff, $C_{on}$ at 644 ff, and a $C_{ration}$ of 41.

III. MEMS Switch Charging Characteristics

Significantly, the RF MEMS capacitive switch 1000 with UNCD as one embodiment of a "fast discharge diamond dielectric layer" may exhibit electromechanical performance as good as state-of-the-art RF MEMS switches with silicon dioxide ($SiO_2$) or silicon nitride ($SiN_x$) dielectric layers. However, the RF MEMS capacitive switch 1000 with the "fast discharge dielectric layer" of UNCD exhibits uniquely different charging characteristics, with charging and discharging time constants 5-6 orders of magnitude quicker than those of conventional RF MEMS switches with oxide or nitride dielectric layers. The RF MEMS capacitive switches with a UNCD dielectric layer (film) can provide devices which have essentially no adverse effects of dielectric charging and can be operated near-continuously in the actuated state without significant degradation in reliability.

By comparison, traditional switch dielectrics such as $SiO_2$ and $SiN_x$ typically have bulk charging and discharging time constants of 10 to 100+ seconds. As the traditional switches operate, charges build up within their dielectric, and they experience a very gradual change in pull-in and release voltages until the ultimate charging failure of the dielectric, causing the switch to become inoperable. With bulk charging, this failure is characterized by the release voltage dropping to zero and the device becoming stuck down in the traditional switch. After failure, the traditional switch requires a sufficiently long period of time to recover (in which the charges are eliminated from the dielectric layer through bleed-off and/or neutralization) before it is able to release. This typical recovery time will be hundreds to thousands of seconds.

Figure 3A:
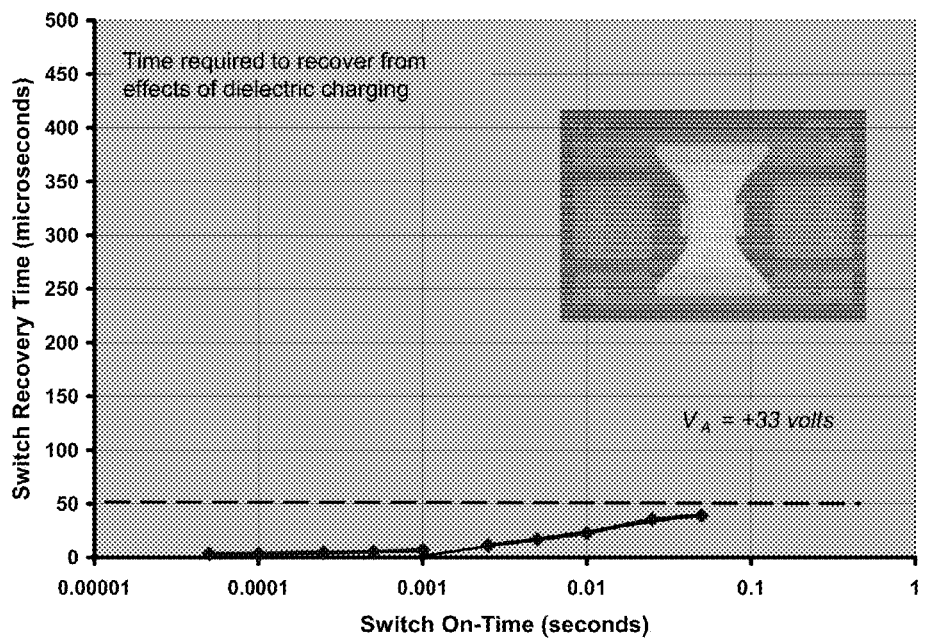
FIG. 3 in parts (a) and (b) is a diagram and chart illustrating discharge data for a RF MEMS capacitive switch.
Figure 3B:
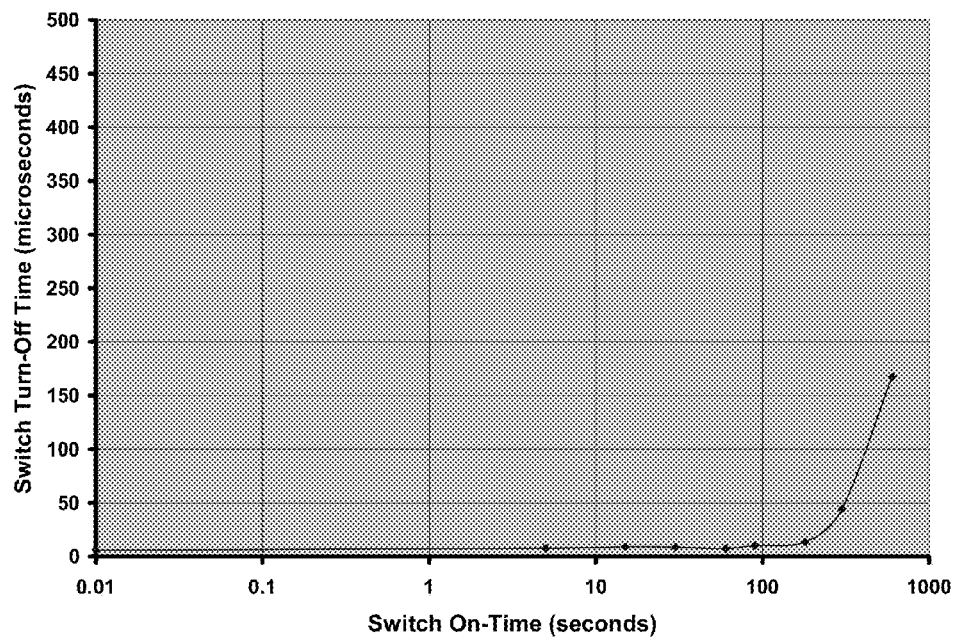

FIG. 3 shows diagram and chart showing discharge data in parts (a) and (b) for RF MEMS capacitive switches with UNCD dielectric films grown at different temperatures. FIG. 3 (a) and (b) show that the discharge time (represented by the Y-axis) is in the range of microseconds, which is orders of magnitude shorter than for conventional switches with a silicon oxide or silicon nitride dielectric layer. In addition, FIG. 3 (b) shows that the improved UNCD sysnthesis process (at 400 degrees Celsius, compatible with CMOS processing) provides greater than (>) 1000 times improvement in recovery time from dielectric charging compared to higher temperature UNCD, allowing to have the switch on for much longer time.

After careful measurements, it was determined that switches with UNCD dielectrics, such as embodiments of the RF MEMS switch 1000 described here, have time constants, for example on the order of 100 μS, that are 5-6 orders of magnitude quicker than those of conventional materials, which are on the order of tens to hundreds of seconds. With these very short time constants, the RF MEMS switch 1000 fails almost immediately, less than a millisecond after actuation. As is characteristic of bulk charging in traditional switches, the device becomes stuck down.

However, after the switch bias is removed, the RF MEMS switch 1000 recovers almost immediately, causing the charges to dissipate and the RF MEMS switch 1000 to release. The switch recovery time for the RF MEMS switch 1000 is dependent on the quick-discharge dielectric properties, the applied electric field, and the switch on-time, as described below for FIGS. 7 and 8. Therefore, the time required for recovery and release is, in part, dependent on the quick-discharge dielectric properties, the applied electric field, and the switch on-time. The recovery time may be very quick relative to the operating timeline of the MEMS device.

Figure 7:
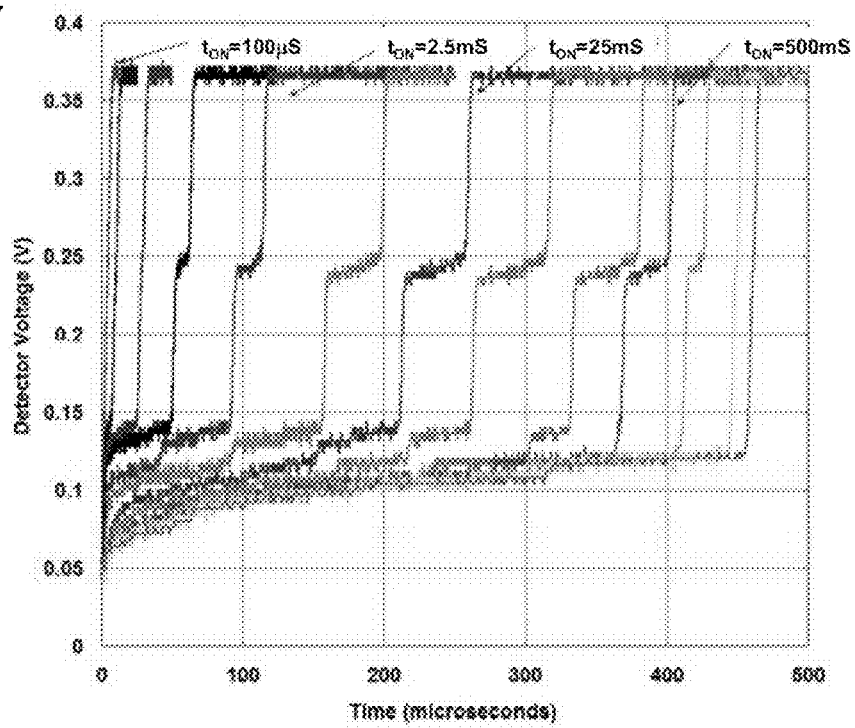
FIG. 7 is a diagram and chart showing time domain measurements of a RF MEMS capacitive switch, showing the switch recovery dependence with switch on-time.

FIG. 7 shows data on the charging/discharging phenomenon for one embodiment of the RF MEMS switch 1000, revealing that the release time of the RF MEMS switch 1000 is a function of the switch on-time. The vertical axis is detector voltage monitoring transmitted RF power, and thus the position of the membrane. The operating voltage on the lower electrode 101 was −33 volts relative to ground. It can be seen that switch recovery time, $t^{OFF}$ can take many hundreds of microseconds depending on the switch on-time, $t^{ON}$. In the most extreme cases, switches required milliseconds to recover.

Figure 8:
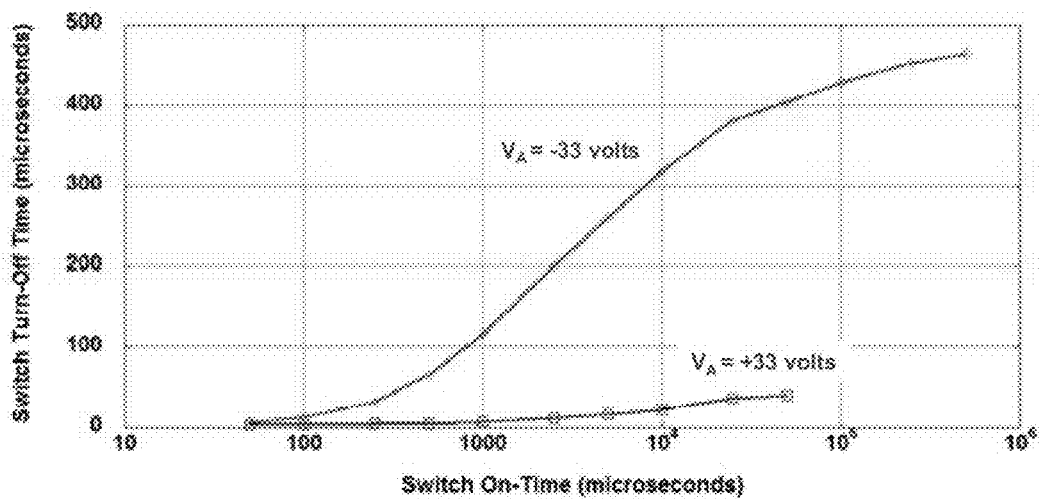
FIG. 8 is a diagram and chart showing measurements of the switch recovery time as a function of switch on-time for a RF MEMS capacitive switch.

The switch recovery time for one embodiment of the RF MEMS switch 1000 can be plotted as a function of on-time, and is shown for both positive and negative bias voltages in FIG. 8. FIG. 8 shows that there can be a saturation effect to the induced charge, so the recovery time does not continue to grow significantly with extended switch on-time. FIG. 8 also shows that there can be significant differences in recovery time depending on the polarity of the applied voltage.

The reason for this uniquely different operation is that the charging and discharging time constants of the UNCD dielectric layer 108 are very short, relative to conventional materials such as such as SiO2 and SiNx. As the RF MEMS capacitive switch 1000 is actuated and charges, bulk charging aids in the actuation of the switch and there is no perceived difference in actuation time. However, the release of the switch 1000 is delayed until the accumulated charges have had sufficient time to recombine and/or dissipate. This has the effect of making the switch release time dependant on the switch on-time and subsequent dissipation of accumulated charges.

While the data shown in FIGS. 7 and 8 provide qualitative characteristics of the charging operation of at least one embodiment of the RF MEMS switch 1000, these figures do not provide detailed information on the charging characteristics. To better characterize the charging phenomenon, pulsed s-parameter measurements were performed to investigate the charging characteristics of the RF MEMS capacitive switch with a UNCD dielectric layer.

Figure 9:
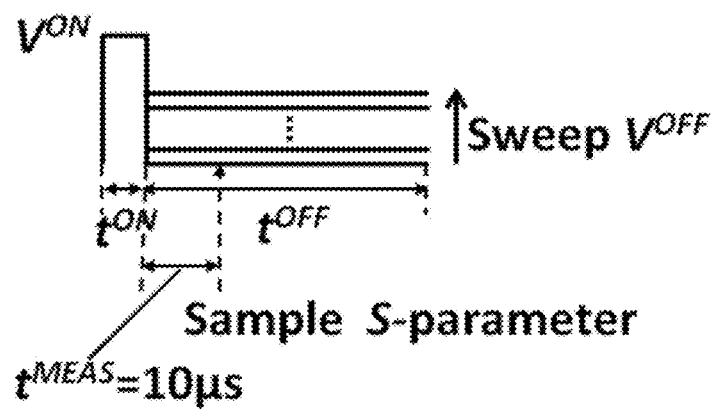
FIG. 9 is a test voltage waveform used to characterize dielectric discharging in an RF-MEMS switch.

As shown in FIG. 9, a voltage waveform can be used to study dielectric charging of at least one embodiment of the RF MEMS switch 1000. First, a control voltage of VON≥33 V can used to pull in the switch and to charge the dielectric for different tON times. Next, the control voltage is reduced to VOFF=0 and, at 10 microseconds (μs) after the control voltage is reduced from VON to VOFF, the switch capacitance is sampled to see whether or not the switch is released. Usually, the mechanical release process takes less than 10 μs to complete. Therefore, if the RF MEMS switch 1000 is released, its capacitance should decrease significantly. Once the RF MEMS switch 1000 is confirmed to have been released, VOFF is incremented by 0.1 V for the next charging cycle, after tOFF≥20 milliseconds (ms) to ensure most of the charge is dissipated, and the RF MEMS switch 1000 returns to its "off" state at the beginning of the next charging cycle. This way, the cycles are repeated until the RF MEMS switch 1000 fails to release after 10 μs and the VOFF then is deemed the release voltage.

Figure 10:
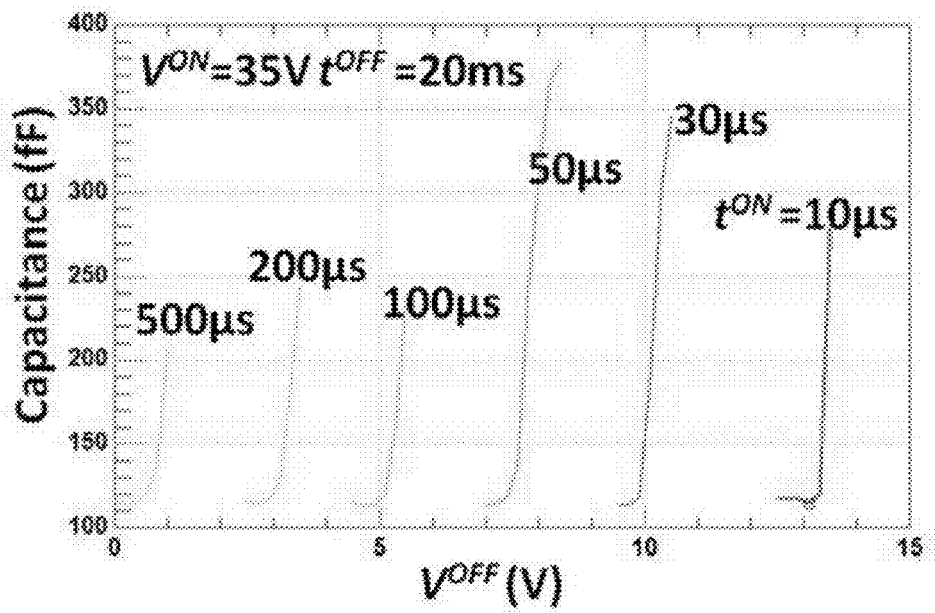
FIG. 10 is a diagram and chart illustrating the dielectric charging in a RF MEMS capacitive switch, which shows a decrease of release voltage as a function of charging time $t^{ON}$, when using 35 volts control voltage for the RF MEMS capacitive switch.

FIG. 10 shows that the release voltage of at least one embodiment of the RF MEMS switch 1000 decreases monotonically from 13 V to 0 when the charging time is increased from 10 μs to 500 μs.

Because the magnitude of the release voltage decreases after charging, charging appears to be in the bulk instead of the surface of UNCD dielectric layer 108. By assuming the charge distributed in the bulk of UNCD has the same effect as a sheet charge in the middle of the film, the shift in release voltage can be fitted to the following formula:

$$\Delta V = (dQ_0/2\epsilon_O\epsilon_R)[1-\exp(-t^{ON}/\tau_C)]$$

where d is the thickness of the UNCD dielectric layer 108, $Q_0$ is the steady-state charge density, $\epsilon_0$ is the vacuum permittivity, $\epsilon_R = 5.2$ is the diamond film relative dielectric constant, and $\tau_c$ is the charging time constant.

Figure 11:
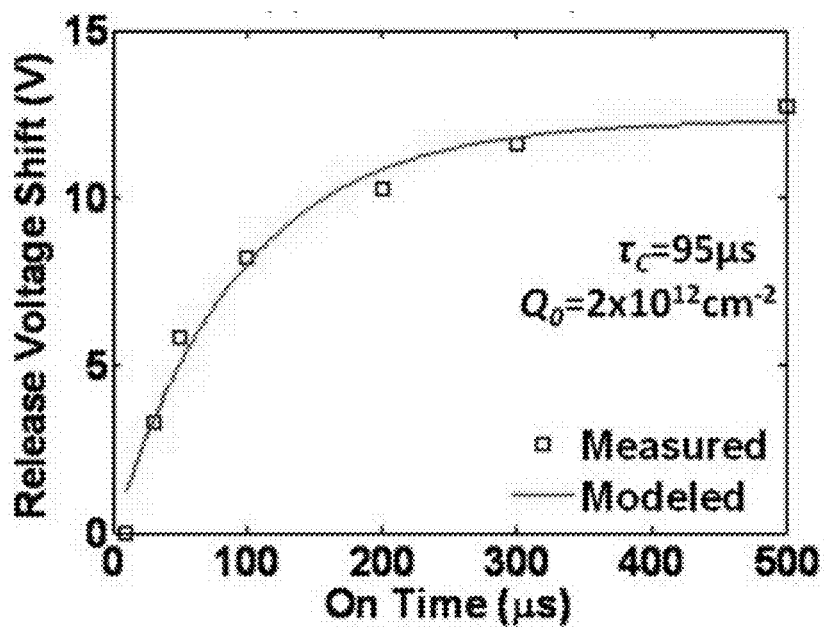
FIG. 11 is a diagram and chart showing measured versus modeled shift in release voltage as a function of charging time under 35 volt control for an RF MEMS capacitive switch.

FIG. 11 shows that the measured release-voltage shift of at least one embodiment of the RF MEMS switch 1000 is best fitted with $\tau_C = 95$ μs and $Q_0 = 2 \times 10^{12}/cm^2$.

Table I, shown below, lists the charge densities and time constants. These results are in contrast to charging in $SiO_2$ or $SiN_x$, which involves time constants on the order of 10 sec and charge density in the order of $10^{11}$ q/cm$^2$, under comparable fields of $10^6$ V/cm.

TABLE I

Charge Density and Time Constant of UNCD Switches

| Wafer | Dielectric Thickness d (μm) | Dielectric Constant $\epsilon_R$ | Switch | Stress Voltage $V^{on}$ (V) | Charge Density Q0 ($10^{12}/cm^2$) | Time Constant $\tau_c$ (ms) |
|---|---|---|---|---|---|---|
| 1 | 0.33 | 5.2 | 06C-0110 | +35 | 2.0 | 0.095 |

The measurements described above imply that the UNCD possesses very short charging and discharging time constants. Charge carriers are concentrated at the grain boundaries, and since the grains are nano-sized, they do not have far to travel to diffuse into or out of the dielectric. In essence, the switch pulls down and almost immediately charges to failure. However, when the applied voltage is removed, the charges leave the dielectric almost immediately, depending on how long the switch was in the down or on position. The switch may recover from charging within a designated operating off time (e.g. about 50 μS). With this mode of operation, the switch may be allowed to recover fully from charging before the next switch operation ensues.

IV. Implications to Switch Operation

RF MEMS capacitive switch 1000 with a quick discharge dielectric, such as the UNCD dielectric layer 108, may provide five to six orders of magnitude quicker recovery times than conventional prior art RF MEMS capacitive switches. In at least one embodiment, the RF MEMS switch 1000 left in the "on" state for 100 seconds recovered back to its original condition, the "off" state, in less than 50 μS. This implies that if the RF MEMS switch 1000 is cycled off once for a period of about 50 μS out of every 100 seconds, the RF MEMS switch 1000 will be fully recovered from any effects of charging and are ready to be reused anew.

The RF MEMS switch 1000 only has to be turned off about 0.00005% of the operating timeline, for example 50 μS out of every 100 seconds in an operating timeline, to recover from dielectric charging failure, due to the operating on time. The switch 1000 may operated nearly continuously in the "on" state shown in FIG. 2B, for example for about 99.99995% of its operating timeline, without suffering adverse effect of accumulated dielectric charges. It should be understood by persons of ordinary skill in the art that operation of an RF MEMS switch 1000 in its "on" state for greater than or equal to about 99% (within a tolerance of about plus 1% or minus 9%) of each operating cycle with only less than 1% of the operating cycle dedicated to quick discharge of the dielectric layer 108 may be considered "near continuous" operation of the switch 1000 in the "on" state. The implication is that over the entire operating timeline, RF MEMS switch 1000 may be operated nearly continuously in the "on" state for greater than equal to about 99% of the operating timeline, without the switch 1000 failing to operate, for example failing to complete a switching operation, due to dielectric charging failure.

The results presented above from tests of RF MEMS switches with the UNCD dielectric layer demonstrate may alleviate at least some of the disadvantages of dielectric charging. The quick discharge dielectric layer 108 provides for longer operation on time without risk of accumulating charge in the dielectric and dielectric failure requiring an extended recovery time, or operation off time, that interrupts the operating timeline, which is experienced by conventional RF MEMS devices. The quick discharge dielectric layer 108 may enable ultra-low loss, low power consumption, and especially linear operation of MEMS devices to be used in a manner that is repeatable and reliable.

Figure 5:
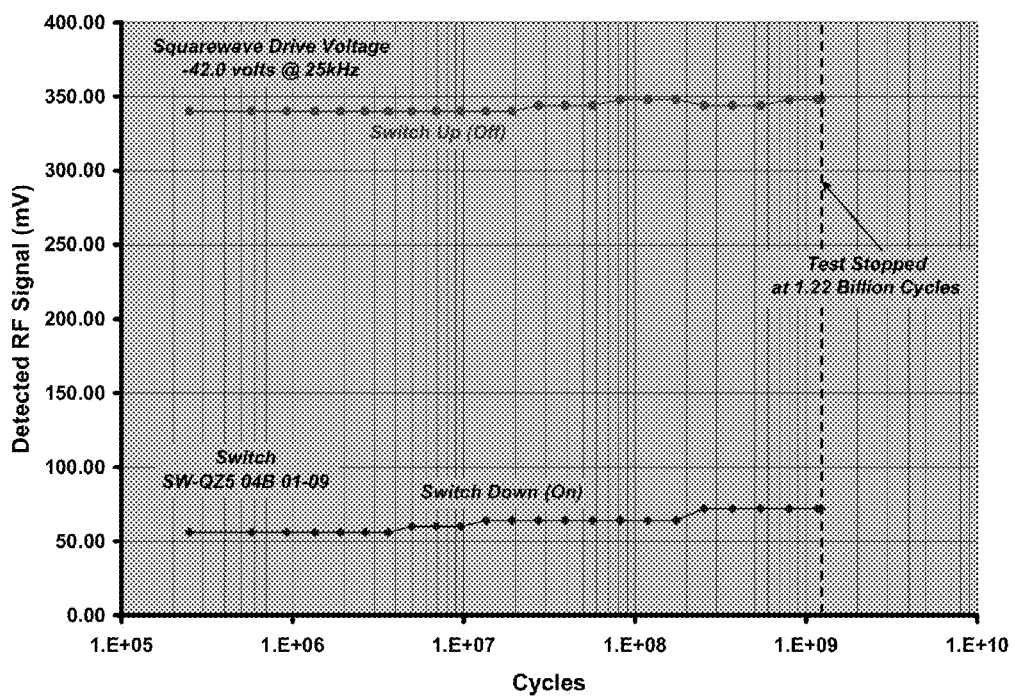

Tests of RF MEMS capacitive switches with a UNCD dielectric layer have shown order of magnitudes shorter discharging times with respect to RF MEMS switches using conventional silicon oxide or silicon nitride dielectric layers. RF MEMS capacitive switches with UNCD dielectric layers have been tested up to 12 billion cycles and show excellent performance. FIG. 5 is a diagram and chart illustrating a switch life-time of the RF MEMS capacitive switch with the UNCD dielectric layer, which worked successfully for more than one billion cycles, demonstrating the longevity of the switch.

The incorporation of ultrananocrystalline (UNCD) films as a "fast discharge dielectric layer" for RF MEMS switches has been demonstrated in this invention. Other materials of a similar nanocrystalline or microcrystalline structure may provide similar properties, being a dielectric that can have a fast discharge time constant. The charging and discharging times constants for the UNCD diamond films are on the order of 100 μs and about 5-6 orders of magnitude faster than those of conventional insulating films. For the first time, this offers the possibility of operating capacitive MEMS switches that are almost continuously "on" without an adverse impact on switch reliability.

In other embodiments the dielectric layer 108 may comprise nano-crystalline diamond (NCD) or micro-crystalline diamond (MCD). NCD grain size may be about 10-50 nanometers (nm). MCD grain size may be about 0.2 to 1.0 micrometers. Generally, it is expected that charging and discharging time constants for dielectric layers using NCD and MCD will be larger than those found for UNCD. The expected time constants for NCD and MCD are still expected to allow for relatively quick recovery of the dielectric layer from charging failure. In some embodiments, it is expected that NCD and MCD will allow for near continuous operation of an MEMS device, such as an RF MEMS switch.

Although embodiments of the invention have been shown and described, it is to be understood that various modifications, substitutions, and rearrangements of parts, components, as well as other uses of the RF MEMS capacitive switch, can be made by those skilled in the art without departing from the novel spirit and scope of this invention.

RF MEMS capacitive switches with a UNCD dielectric layer (film) provide variable capacitors that can be used to control and route microwave and millimeter-wave signals. Uses and applications for the newly invented RF MEMS capacitive switches can include phase shifters for electronically scanned antenna arrays and tunable filters for spectrum control and anti-jamming. RF MEMS capacitive switches can be used in military and commercial radar and communications systems.

RF MEMS capacitive switches with a UNCD dielectric layer may be used advantageously numerous applications that would benefit from the reliable, immediately available performance of the dielectric layer described here as dielectric layer 108. These applications include use in phase shifter for phase array antennas, cell phone communications, industrial automation, PC peripherals, automatic test equipment, medical devices, instruments and military/aerospace equipment. RF MEMS capacitive switches with a dielectric layer having quick discharge properties, such as a UNCD dielectric layer offer promise of cost effective, high performance devices over a wide range of applications. RF MEMS capacitive switches with a dielectric layer having quick discharge properties, such as a UNCD dielectric layer can operate in harsh environments with a much longer operating life.

One embodiment of an electrostatic MEMS device, presented in this disclosure, is that of an RF MEMS capacitive switch 1000. However, a skilled practitioner in the art will realize that a broad array of other devices and components may benefit from the embodiments disclosed in this application, which include dielectrics that separate a first and a second conductor, where one conductor is moveable towards the other conductor. The devices that may benefit from the disclosed embodiments having a dielectric with quick discharge properties include electrostatic actuators for electrical switches, optical switches, tunable capacitors, and movable optical mirrors. Also, a variety of micromachined components incorporating electrostatic comb drives to implement the actuation may also benefit from the embodiments disclosed having dielectrics with quick-discharge properties. Another category of devices that may benefit from the disclosed embodiments include adaptive optics devices which may incorporate insulating layers, such as multi-pixel displays for televisions, projectors, and wireless handheld devices. Similarly, this includes optical wave-front modulators.

Other devices which may benefit from the disclosed embodiments include micromachines or MEMS sensor devices, which are generally mechanical systems that are designed to realize a variable capacitor as a sensing structure, and which may benefit from incorporating quick-discharge insulating films within their construction. Electronics are used to convert the variable capacitance of this sensor to a variable voltage or current, amplify, linearize, and in some cases, temperature compensate the sensed signal. These sensors may be incorporated into components such as accelerometers, rate sensors, gyroscopes, pressure sensors, and a variety of mass sensing biological sensors. Also, these sensors may be used as biosensors which operate using applied electric fields, which may benefit from incorporating quick discharge dielectric layers, such as DNA detectors and a variety of microfluidic systems.

These descriptions are not meant to be construed in a limiting sense. Various modifications of the disclosed embodiments, as well as alternative embodiments of the invention will become apparent to persons skilled in the art upon reference to the description of the invention. It is therefore contemplated that the claims will cover any such modifications or embodiments that fall within the true scope and spirit of the invention.

More information is provided in the attached Appendix A entitled "Charging Characteristics of Ultra-Nano-Crystalline Diamond in RF MEMS Capacitive Switches" by C. Goldsmith et al., and in the attached Appendix B entitled "Advances in MEMS Capacitive Switch Technology" by "Charles L. Goldsmith et al.

We claim:

1. An electrostatic microelectromechanical (MEMS) device, comprising:
    a dielectric layer separating a first conductor and a second conductor, wherein the first conductor is moveable towards the second conductor when a first voltage is applied to the MEMS device; and
    wherein the dielectric layer recovers from dielectric charging failure within about one thousand (1000) microseconds following removal of the first voltage.

2. The electrostatic MEMS device of claim 1, further comprising:
    the first conductor comprising a first electrode mounted on a substrate, wherein the first electrode is electrically connected to a ground path;
    the second conductor comprising a second electrode mounted on the substrate and connected to an RF signal path, wherein the first electrode comprises a moveable membrane suspended over the second electrode; and
    wherein the dielectric layer is deposited between the first electrode and the second electrode to allow an RF signal in the RF signal path to capacitively couple from the first electrode to the second electrode.

3. The electrostatic MEMS device of claim 2, wherein the dielectric layer comprises an ultra-nano-crystalline diamond (UNCD) thin film.

4. The MEMS device of claim 1, wherein the dielectric layer is configured to recover from dielectric charging failure within about fifty (50) to one thousand (1000) microseconds.

5. The electrostatic MEMS device of claim 2, wherein the dielectric layer comprises ultra-small grains of dielectric a size of 3-5 nanometers and about 0.4 nanometer grain boundaries.

6. A method for actuating a RF MEMS switch, the method comprising:
    providing an RF MEMS switch having a first electrode electrically connected to a ground path, the first electrode comprising a moveable membrane suspended over a second electrode to provide a gap for movement of a portion of the moveable membrane towards the second electrode, wherein a dielectric layer separates the first electrode from the second electrode;
    wherein the second electrode is connected to a radio frequency (RF) signal path, and wherein the dielectric layer extends on top of the second electrode to allow RF signals in the RF signal path to capacitively couple from the first electrode to the second electrode;
    applying a first voltage from the first electrode to the second electrode to actuate the moveable membrane to an "on" position, wherein application of the first voltage causes the dielectric layer to fail due to dielectric charging; and
    removing the first voltage, wherein upon removal of the first voltage, the dielectric layer recovers within about one thousand (1000) microseconds to return the moveable membrane to an "off" position.

7. The method of claim 6, wherein the dielectric layer recovers from dielectric charging failure within a range of about fifty (50) to one thousand (1000) microseconds.

8. The method of claim 7, comprising:
    operating the RF MEMS switch over an operating timeline, wherein the operating timeline comprises two or more operating cycles, wherein each operating cycle comprises the time between application of the first voltage and application of a second voltage to the RF MEMS switch;

applying the first voltage and removing the first voltage within each operating cycle, wherein the time between application of the first voltage and removal of the first voltage comprises an operating on time; and wherein the dielectric layer fails due to dielectric charging within each operating on time and recovers from the dielectric charging failure almost immediately following removal of the first voltage to return the moveable membrane to the "off" position.

9. The method of claim 8, wherein the time between removal of the first voltage and application of the second voltage comprises an operating off time for each operating cycle, and wherein the operating off time comprises about 50 microseconds.

10. The method of claim 8, comprising:

refraining from applying a second voltage to follow removal of the first voltage until the dielectric layer has recovered from dielectric charging failure, wherein the time between removal of the first voltage and application of the second voltage comprises a operating off time for each operating cycle; and wherein the operating off time for each operating cycle is less than or equal to about 1% of the time for each operating cycle.

11. The method of claim 10, wherein the operating off time for each operating cycle is about 0.00005% of the time for each operating cycle.

12. The method of claim 10, wherein a total operating off time comprises the sum of each operating off time from each operating cycle over the operating timeline of the RF MEMS switch; and wherein the total operating off time comprises less than or equal to about 1% of the operating timeline.

13. The method of claim 12, wherein the total operating off time comprises about 0.00005% of the operating timeline.

14. The method of claim 9, wherein the dielectric layer comprises an ultra-nano-crystalline diamond (UNCD) thin film.

* * * * *